(12) United States Patent
Wu et al.

(10) Patent No.: US 12,068,239 B2
(45) Date of Patent: Aug. 20, 2024

(54) SEMICONDUCTOR STRUCTURE WITH CONDUCTIVE PLUG AND CAPACITOR ARRAY

(71) Applicant: CHANGXIN MEMORY TECHNOLOGIES, INC., Hefei (CN)

(72) Inventors: Ping-Heng Wu, Hefei (CN); Jie Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 426 days.

(21) Appl. No.: 17/448,892

(22) Filed: Sep. 26, 2021

(65) Prior Publication Data

US 2022/0093506 A1    Mar. 24, 2022

Related U.S. Application Data

(63) Continuation of application No. PCT/CN2021/103321, filed on Jun. 29, 2021.

(30) Foreign Application Priority Data

Sep. 23, 2020    (CN) .......................... 202011013111.8

(51) Int. Cl.
  *H01L 23/522*    (2006.01)
  *H01L 23/00*    (2006.01)
  *H01L 23/48*    (2006.01)
  *H01L 27/02*    (2006.01)

(52) U.S. Cl.
  CPC ........ *H01L 23/5223* (2013.01); *H01L 23/481* (2013.01)

(58) Field of Classification Search
  CPC ............... H01L 23/5223; H01L 23/481; H01L 27/0207; H01L 23/562; H01L 28/40; H01L 23/5225; H01L 23/5222; H01L 23/528
  See application file for complete search history.

(56) References Cited

U.S. PATENT DOCUMENTS

| 6,333,240 | B1 | 12/2001 | Durcan | |
|---|---|---|---|---|
| 6,720,232 | B1 | 4/2004 | Tu | |
| 8,148,223 | B2 | 4/2012 | Lin | |
| 2007/0267674 | A1 | 11/2007 | Lin | |
| 2008/0122032 | A1 | 5/2008 | Tu | |
| 2013/0320554 | A1* | 12/2013 | Barth | H01L 21/7682 257/E21.586 |
| 2014/0070366 | A1* | 3/2014 | Yen | H01L 29/66181 257/532 |
| 2015/0028450 | A1* | 1/2015 | Park | H01L 21/76898 257/532 |

FOREIGN PATENT DOCUMENTS

| CN | 101127355 A | 2/2008 |
|---|---|---|
| CN | 101140929 A | 3/2008 |
| CN | 101789390 A | 7/2010 |
| CN | 110648976 A | 1/2020 |
| JP | 2018098461 A | 6/2018 |

* cited by examiner

*Primary Examiner* — Herve-Louis Y Assouman
(74) *Attorney, Agent, or Firm* — Syncoda LLC; Feng Ma

(57) ABSTRACT

A semiconductor structure includes: a substrate and a dielectric layer arranged on the substrate; a conductive plug, a first portion of the conductive plug being arranged in the substrate, and a second portion of the conductive plug being arranged in the dielectric layer; and a capacitor array, the capacitor array at least surrounding the second portion of the conductive plug.

20 Claims, 6 Drawing Sheets

SEMICONDUCTOR STRUCTURE WITH CONDUCTIVE PLUG AND CAPACITOR ARRAY

CROSS-REFERENCE TO RELATED APPLICATIONS

This is a continuation application of International Patent Application No. PCT/CN2021/103321 filed on Jun. 29, 2021, which claims priority to Chinese Patent Application No. 202011013111.8 filed on Sep. 23, 2020. The disclosures of these applications are incorporated by reference herein in their entirety.

BACKGROUND

In order to realize the integration and assembly of chips in a Z-axis direction, interconnection between the chips is usually realized through a Through-Silicon Vias (TSV) technology. Specifically, the TSV technology is to form through holes for connecting the upper side and the lower side of a wafer, and the through holes are filled with conductive materials to form an interconnection structure. The conductive materials include different types of metal materials.

SUMMARY

Embodiment of the present disclosure relate to the field of semiconductors, and more specifically to a semiconductor structure.

An embodiment of the present disclosure provides a semiconductor structure, which is beneficial to reduce the influence of the deformation stress generated by a conductive plug on functional elements.

The embodiment of the present disclosure provides a semiconductor structure, which includes: a substrate and a dielectric layer arranged on the substrate; a conductive plug, a first portion of the conductive plug being arranged in the substrate, and a second portion of the conductive plug being arranged in the dielectric layer; and a capacitor array, the capacitor array at least surrounding the second portion of the conductive plug.

BRIEF DESCRIPTION OF THE DRAWINGS

One or more embodiments are exemplarily explained through the figures in accompanying drawings corresponding thereto, these exemplary explanations do not constitute a limitation to the embodiments, elements having the same reference numerals in the accompanying drawings are denoted as similar elements; and unless otherwise specifically declared, the figures in the accompanying drawings do not constitute a limitation of proportion.

DETAILED DESCRIPTION

In an actual application process, the arrangement of the interconnection structure can affect elements arranged on the surface of the silicon wafer and elements arranged in the dielectric layer on the silicon wafer.

Figure 1:
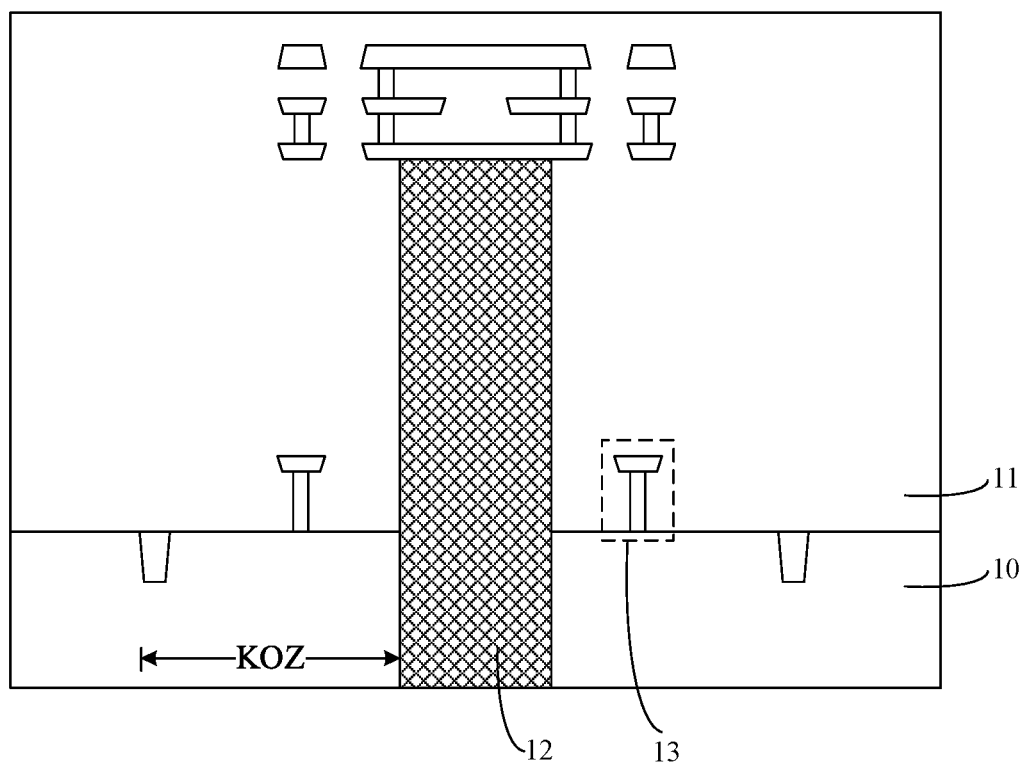
FIG. 1 is a schematic cross-sectional diagram of a semiconductor structure in the related art.
Figure 2:
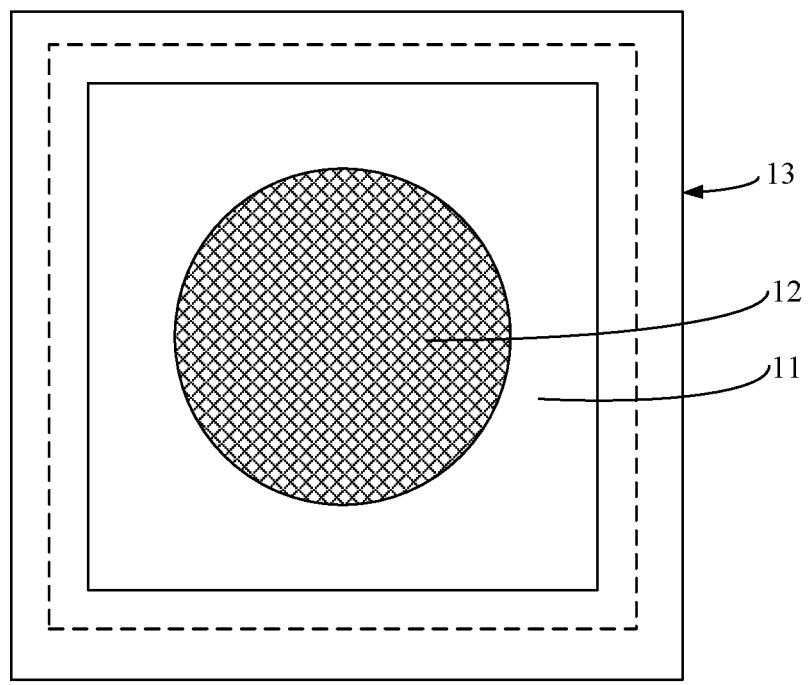
FIG. 2 is a top view of a semiconductor structure shown in FIG. 1.

Referring to FIG. 1 and FIG. 2, FIG. 1 is a schematic cross-sectional diagram of a semiconductor structure in the related art, and FIG. 2 is a top view of a semiconductor structure shown in FIG. 1. The semiconductor structure includes: a substrate 10 and a dielectric layer 11 arranged on the substrate 10; and a conductive plug 12, in which the conductive plug 12 is arranged in the substrate 10 and the dielectric layer 11.

The conductive plug 12 usually contains a metal material, and the metal material is prone to expand and contract when subjected to a thermal stress. When a thermal expansion coefficient of the conductive plug 12 is different from a thermal expansion coefficient of the dielectric layer 11 and a thermal expansion coefficient of the substrate 10, a stress concentration phenomenon may occur, which in turn causes the substrate 10 and the dielectric layer 11 to deform. The deformation of the substrate 10 and the dielectric layer 11 may affect the characteristics of the functional elements in the functional zone, and even cause structural damage to the semiconductor structure.

The functional zone is a workable zone of the functional elements, and includes a surface of the substrate 10 and an interior of the dielectric layer 11. The functional elements on the surface of the substrate 10 are generally referred to as active areas.

It should be noted that in addition to the direct stress from the conductive plug 12, the stress that causes the substrate 10 and the dielectric layer 11 to deform may also come from the secondary stress caused by the deformation of other adjacent film layers. For example, the compressive stress of the conductive plug 12 causes the substrate 10 to deform, and the deformed substrate 10 applies stress to the dielectric layer 11 due to the structural change thereof, which in turn causes the dielectric layer 11 to deform.

At present, only a grounded isolation ring structure 13 is provided to shield part of the electric field of the conductive plug 12, so as to reduce the influence of the electric field of the conductive plug 12, but there is no method to solve or counteract the deformation of the substrate 10 and the dielectric layer 11. In order to prevent the deformation of the substrate 10 and the dielectric layer 11 from affecting the functional elements in the functional zone, the functional elements are usually arranged outside a Keep Out Zone (KOZ), that is, the functional elements are arranged away from the conductive plug 12. However, such a solution will greatly compress the reserved space for the functional elements, which is not conducive to the integration of the chips or the functional elements.

According to a semiconductor structure provided in an embodiment of the present disclosure, a capacitor array surrounding the conductive plug is provided, so as to reduce the magnitude of the deformation stress passing through the capacitor array, and to ensure that the deformation stress has a small impact on the functional zone arranged on a side of the capacitor array away from the conductive plug, thereby ensuring that the functional elements in the functional zone may work effectively and that the semiconductor structure has good performance.

In order to make the objectives, technical solutions and advantages of the embodiments of the present disclosure more apparent, hereinafter, the respective embodiments of the present disclosure will be described in detail in connection with the accompanying drawings. However, those ordinary skilled in the art may understand that, in the respective embodiments of the present disclosure, numerous technical details are set forth in order to provide a reader with a better understanding of the present disclosure. However, the technical solutions claimed in the present disclosure can also be implemented without these technical details and various changes and modifications based on the respective embodiments below.

Figure 3:
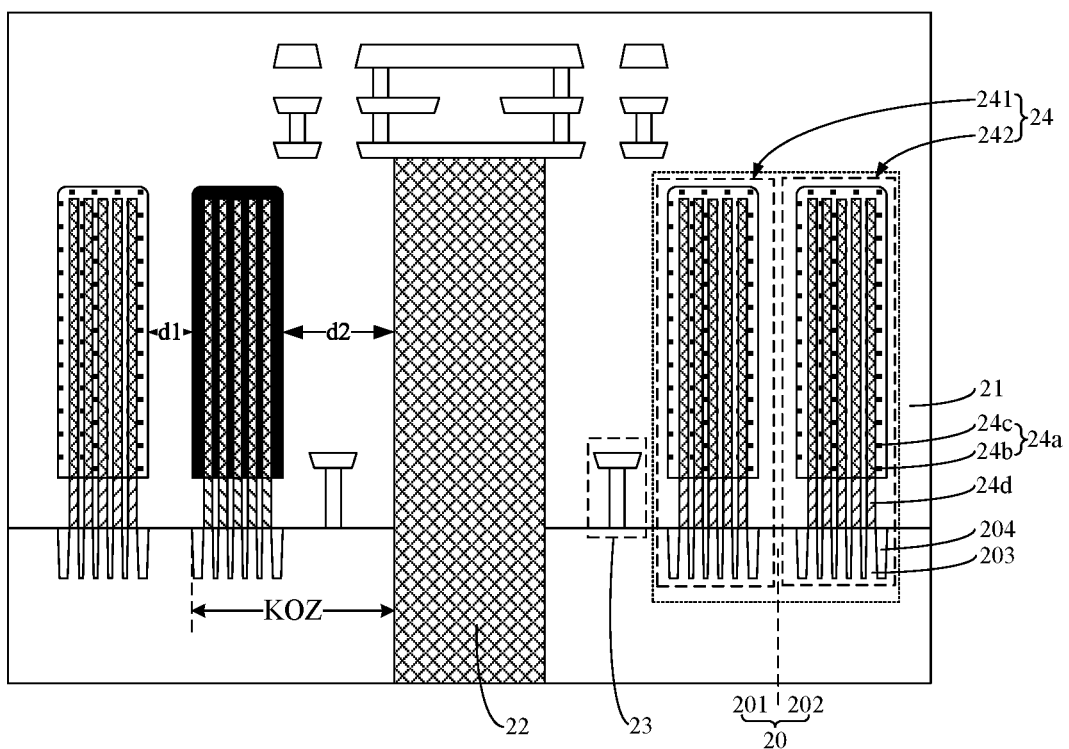
FIG. 3 is a schematic cross-sectional diagram of a semiconductor structure according to an embodiment of the present disclosure.
Figure 4:
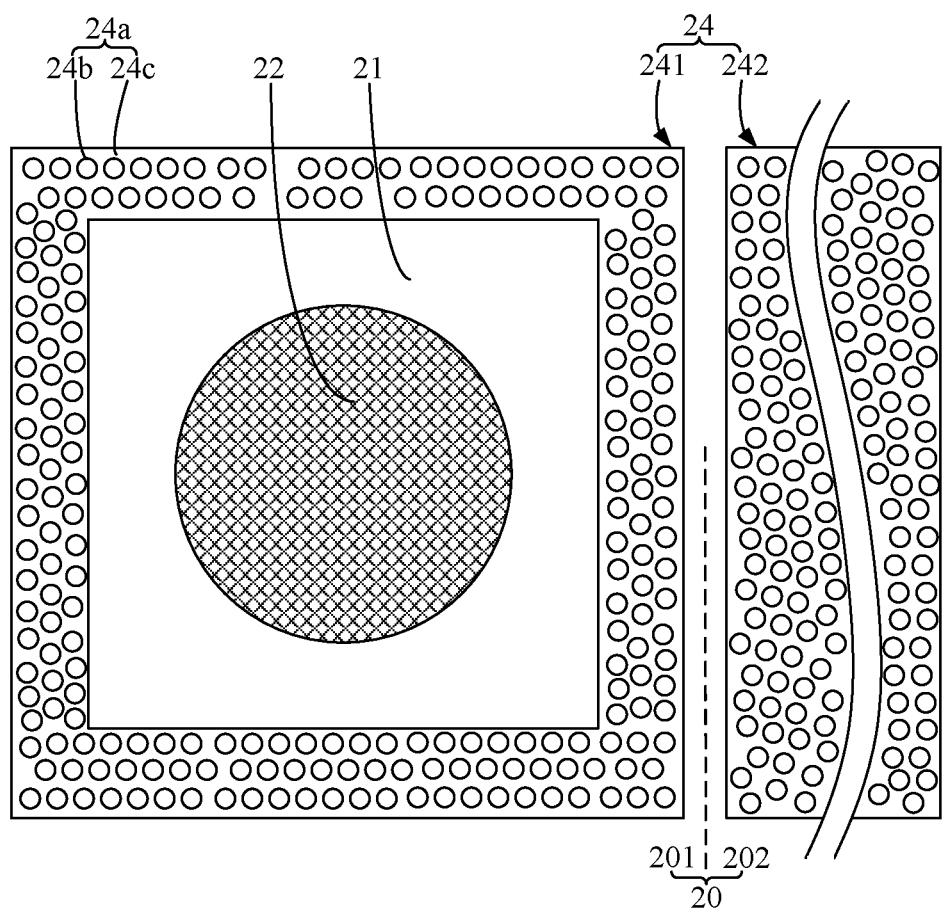
FIG. 4 is a top view of a semiconductor structure shown in FIG. 3.

In the embodiment of the present disclosure, referring to FIG. 3 and FIG. 4, the semiconductor structure includes: a substrate 20; a dielectric layer 21 arranged on the substrate 20; a conductive plug 22, in which a first portion of the conductive plug 22 is arranged in the substrate 20, and a second portion of the conductive plug 22 is arranged in the dielectric layer 21; and a capacitor array 24, in which the capacitor array 24 at least surrounds the second portion of the conductive plug 22.

The capacitor array 24 is formed by a plurality of capacitor circuits 24a. In a direction parallel to a surface of the substrate 20 and away from the conductive plug 22, the capacitor array 24 has a plurality of interfaces. The interfaces will hinder the transmission of the deformation stress, that is, attenuate the deformation stress, so as to ensure that the deformation stress transmitted to the functional zone 202 is relatively small, and ensure that the functional elements in the functional zone 202 have good performance.

In the embodiment of the present disclosure, each capacitor circuit 24a includes a double-sided capacitor circuit. The capacitor array 24 includes multiple double-sided capacitor circuits 24a which are successively arranged. The interface in the capacitor array 24 mainly refers to a contact interface between a lower electrode 24b and an upper electrode 24c. In some embodiments of the present disclosure, each capacitor circuit includes a single-sided capacitor circuit. The capacitor array may include multiple capacitor circuits spaced apart from each other, and the interfaces in the capacitor array also include the side wall surfaces of the capacitor circuits.

In the embodiment of the present disclosure, the substrate 20 includes a KOZ 201 and a functional zone 202. The functional zone 202 is arranged on a side of the KOZ 201 away from the conductive plug 22. Each of the KOZ 201 and the functional zone 202 is provided with the capacitor array 24, and the capacitor array 24 in the KOZ 201 surrounds the second portion of the conductive plug 22. By setting the capacitor array 24 at the edge of the KOZ 201 as a transition, a difference between an element arrangement density in the KOZ 201 and an element arrangement density in the functional zone 202 is prevented from being too large, so as to ensure that the functional elements with a relatively large element arrangement density can be provided in the functional zone 202, and to ensure that the functional elements in the functional zone 202 can work effectively.

It should be noted that in the structure shown in FIG. 1, the fact that only the capacitor array 24 is provided in the functional zone 202 is taken as an example. In fact, any functional elements may be provided in the functional zone 202. In addition, hereinafter, for the sake of simplicity of description, the capacitor array 24 in the KOZ 201 is referred to as a first capacitor array 241, and the capacitor array 24 in the functional zone 202 is referred to as a second capacitor array 242.

In the embodiment of the present disclosure, the substrate 20 is provided with an active area 203 in the KOZ 201, and the first capacitor array 241 is electrically connected to the active area 203 in the KOZ 201. In this way, it is beneficial to ensure that the first capacitor array 241 may be actuated through the active area 203, so that the first capacitor array 241 may be used as a backup capacitor and put into use during fuse repair.

In some embodiments of the present disclosure, the KOZ 201 is also provided with a capacitor contact window 24d for connecting the active area 203 and the first capacitor array 241 with each other, and necessary bit lines (not shown), word lines (not shown), or other structures. That is, the electrical structure of the KOZ 201 may be exactly the same as the electrical structure of the functional zone 202. The difference between the electrical structure of the KOZ 201 and the electrical structure of the functional zone 202 is only that the positions of the KOZ 201 and the functional zone 202 are different from each other, and the electrical structure of the KOZ 201 is not put into use before fuse repair.

In some embodiments of the present disclosure, in the KOZ 201, the substrate 20 is also provided with an isolation structure 204 for isolating two adjacent active areas 203 from one another. Since the first capacitor array 241 includes a plurality of capacitor circuits 24a, the first capacitor array 241 corresponds to a plurality of active areas 203 and a plurality of isolation structures 204. The existence of the plurality of isolation structures 204 may increase the transmission attenuation of the deformation stress in the substrate 20, so as to avoid the deformation stress from passing through the substrate 20 to cause a relatively large impact on the functional elements in the dielectric layer 21.

In the embodiment of the present disclosure, a pattern of the first capacitor array 241 is the same as a pattern of the second capacitor array 242. In this way, the first capacitor array 241 and the second capacitor array 242 may be formed through the same manufacturing process, which is beneficial to reduce the difficulty of the manufacture of the semiconductor structure.

In the embodiment of the present disclosure, when the capacitor array 24 is used to surround the conductive plug 22, the capacitor array 24 at the edge of the structure, which is formed through the same manufacturing process, is selected as the capacitor array 24 surrounding the conductive plug 22. Since the capacitor array 24 at the edge of the structure is easily affected by the edge effect of the structure during the formation, for example, among the multiple trenches formed by etching through a same mask, the top openings of the trenches at the edge of the structure are relatively small, the data storage performance of the capacitor array 24 at the edge of the structure may be relatively poor.

In the case where the data storage performance of the capacitor array 24 at the edge of the structure may be relatively poor, the capacitor array 24 is used as a transitional high-density functional element arranged in the KOZ 201, which is beneficial to realize the function of the capacitor array 24 at the edge of the structure and avoid the capacitor array 24 at the edge of the structure from occupying the space in the functional zone 202, so that more capacitor arrays 24 with good performance are provided in the functional zone 202 to improve the performance of the semiconductor structure.

In some embodiments of the present disclosure, when a capacitor array is used to surround the conductive plug, the reserved space region for the conductive plug may be embedded in the entire region of the capacitor array. In this case, the capacitor array which is close to and surrounds a partial region of the reserved space region is easily affected by the conductive plug. The partial region of reserved space region may be defined as a KOZ, and the capacitor array in the partial region of reserved space region may be defined as a backup capacitor.

In the embodiment of the present disclosure, in a direction from the KOZ 201 to the functional zone 202, a first predetermined distance d1 is formed between the first capacitor array 241 and the second capacitor array 242. The existence of the first predetermined distance d1 is beneficial to avoid the first capacitor array 241 affected by the conductive plug 22 from affecting the second capacitor array 242, so as to ensure that the second capacitor array 242 has better performance.

The influence of the first capacitor array 241 on the second capacitor array 242 includes potential influence and structural influence.

For the potential influence: in the embodiment of the present disclosure, in order to prevent the electric field of the conductive plug 22 from affecting the performance of the functional elements in the functional zone 202, the first capacitor array 241 is grounded, or the first capacitor array 241 is grounded through the active area 203, the capacitor contact window 24d, the word line or the bit line, so as to form an electrostatic shielding. Correspondingly, the grounded first capacitor array 241 is at a low potential, and at least a portion of the capacitor circuits 24a in the second capacitor array 242 for data storage stores charges, that is, at least the portion of the capacitor circuits 24a are at a high level. In order to avoid charges from being transferred and leaking due to the potential difference, the first predetermined distance d1 is used for isolation, which can effectively block the transfer path of the charges, thereby ensuring the accuracy and effectiveness of the data storage of the second capacitor array 242.

The grounded first capacitor array 242 may be disconnected from a ground wire when it is subsequently put into use, so as to perform data storage.

For structural influence: since the upper electrode 24c of the current capacitor array 24 is usually a continuous film layer integrally formed, without an internal interface therein, the deformation stress can be transmitted through the upper electrode 24c with a relatively low transmission attenuation. In this way, continuous arrangement of the first capacitor array 241 and the second capacitor array 242 may cause the second capacitor array 242 to be more susceptible to the deformation stress. Electrodes of the capacitor array 24 are usually of a structure with a high height-to-width ratio, so that the electrodes are more sensitive to the deformation stress, and are prone to collapse when subjected to the deformation stress. Therefore, the first predetermined distance d1 is set, so that the upper electrodes 24c of different capacitor arrays 24 may be spaced apart from each other, which is beneficial to ensure that the deformation stress to which the second capacitor array 242 is subjected is relatively small, and that the second capacitor array 242 has high structural stability.

In the embodiment of the present disclosure, the first predetermined distance d1 is comprised between 0.2 μm and 20 μm, for example, 1 μm, 5 μm, or 10 μm. If the first predetermined distance d1 is too small, the first capacitor array 241 will affect the data storage accuracy and structural stability of the second capacitor array 242. If the first predetermined distance d1 is too large, the reserved space in the functional zone 202 may be compressed.

Figure 5:
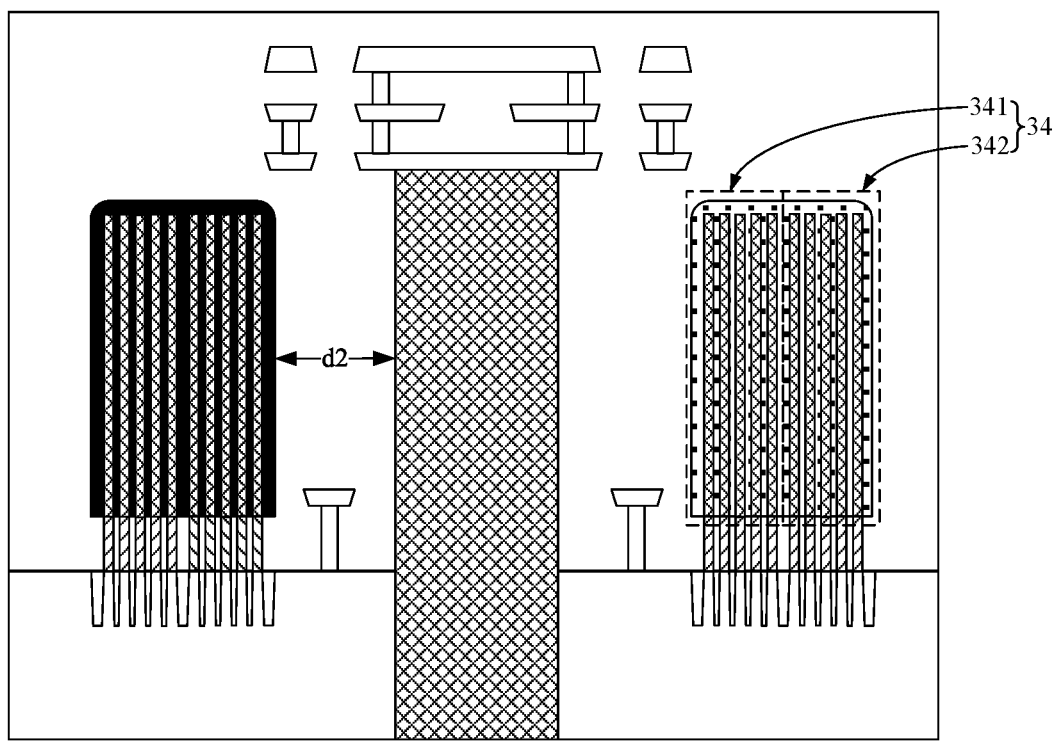
FIG. 5 is a schematic cross-sectional diagram of another semiconductor structure according to an embodiment of the present disclosure.
Figure 6:
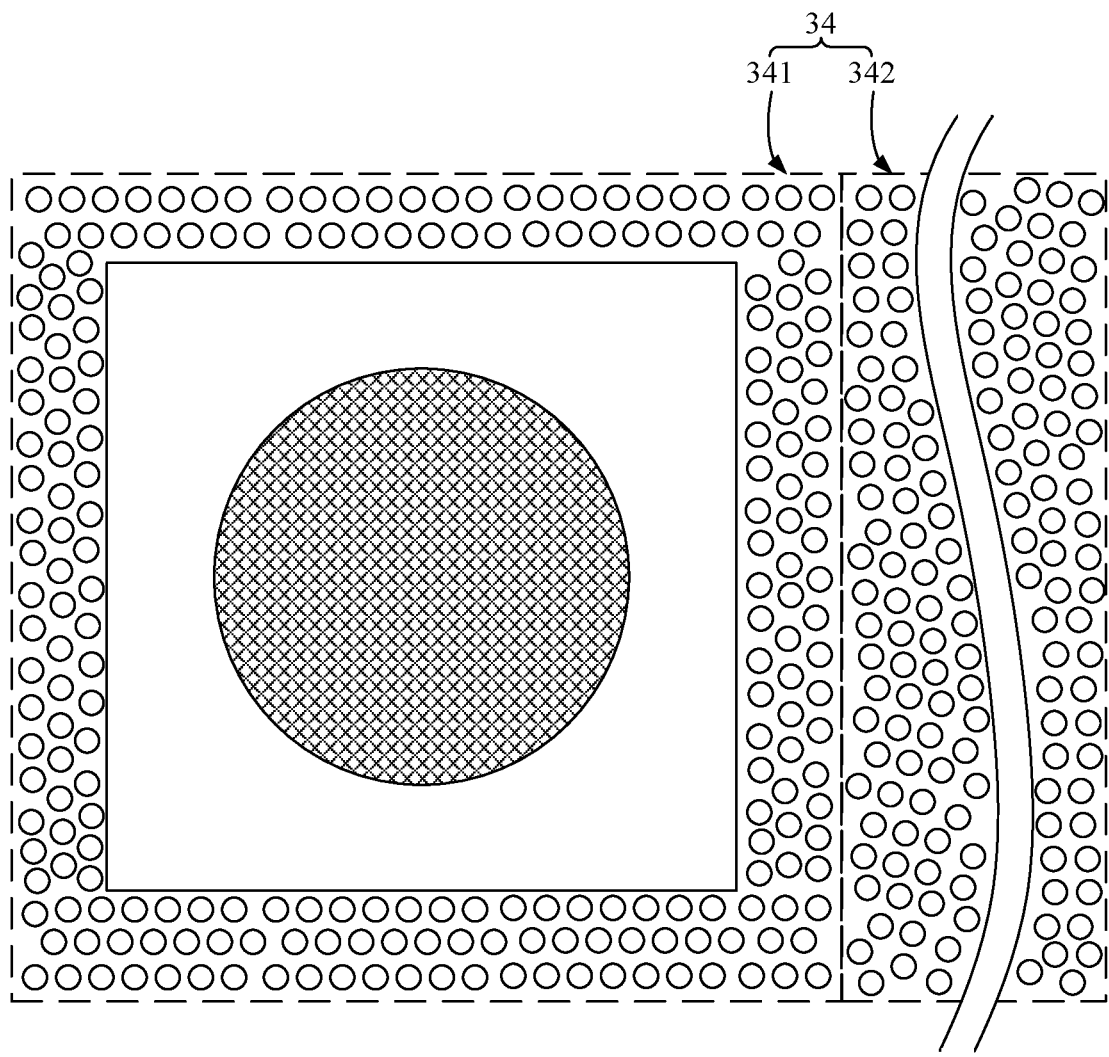
FIG. 6 is a top view of a semiconductor structure shown in FIG. 5.

In other embodiments, referring to FIG. 5 and FIG. 6, the capacitor array 34 is a structure continuously integrally formed, and the first capacitor array 341 and the second capacitor array 342 are continuously arranged. In this way, the first capacitor array 341 and the second capacitor array 342 can be continuously formed by using the same mask, so as to reduce the difficulty of manufacture of the semiconductor structure.

In the embodiment of the present disclosure, the second capacitor array 242 surrounds the second portion of the conductive plug 22, and the surrounding configuration of the first capacitor array 241 is different from the surrounding configuration of the second capacitor array 242.

In some embodiments of the present disclosure, both the first capacitor array 241 and the second capacitor array 242 completely surround the conductive plug 22, but the surrounding configuration of the first capacitor array and the surrounding configuration of the second capacitor array are different from each other. In this way, the distances between the first capacitor array 241 and the second capacitor array 242 may be different in different directions away from the conductive plug 22. Further, the portion of the second capacitor array 242, which is more sensitive to the deformation stress, is arranged farther from the first capacitor array 241, so as to ensure that any portion of the second capacitor array 242 has high structural stability.

In some embodiments of the present disclosure, the first capacitor array 241 may be in a circular shape, and the second capacitor array 242 may be in an elliptical shape. A part corresponding to an end point of the long axis of the ellipse is the portion of the second capacitor array 242 which is more sensitive to the deformation stress. Alternatively, the first capacitor array 241 is in a square shape, and the second capacitor array 242 is in a circular shape. Alternatively, the first capacitor array 241 is in a circular shape, and the second capacitor array 242 is in a polygonal shape, such as in a rhombus shape.

In some embodiments of the present disclosure, the first capacitor array 241 does not completely surround the conductive plug 22, while the second capacitor array 242 completely surrounds the conductive plug 22. In this way, the first capacitor array 241 may be arranged in the partial region, so that the sensitive portion in the second capacitor array 242 can be protected, thereby ensuring that the whole second capacitor array 242 has high structural stability.

In some embodiments of the present disclosure, the first capacitor array 241 may be in an arc shape, and the second capacitor array 242 may be in a circular shape. The first capacitor array 241 may be in a linear shape, and the second capacitor array 242 may be in a square shape.

In the embodiment of the present disclosure, the semiconductor structure further includes an isolation ring structure 23. The isolation ring structure 23 at least surrounds the second portion of the conductive plug 22. The isolation ring structure 23 is arranged between the conductive plug 22 and the first capacitor array 241. An arrangement density of the first capacitor array 241 is greater than an arrangement density of the isolation ring structure 23. In this way, the functional elements with a relatively large arrangement density may be provided in the functional zone 202.

In some embodiments of the present disclosure, the isolation ring structure 23 may be grounded. The first capacitor array 241 may not be grounded. The isolation ring structure 23 plays a role of electrostatic shielding, and the first capacitor array 241 plays a role of blocking the deformation stress. In this way, when the first capacitor array 241 is subsequently put into use, there is no need to disconnect the ground wire of the first capacitor array 241, which is beneficial to improve the applicability of the semiconductor structure.

The isolation ring structure 23 may include a contact portion extending in the same direction as the conductive plug 22, and a metal portion arranged at the top of the contact portion.

Figure 7:
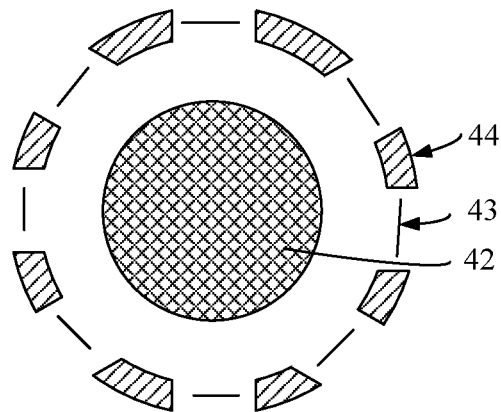
FIG. 7 is a top view of yet another semiconductor structure according to an embodiment of the present disclosure.

In some embodiments of the present disclosure, referring to FIG. 7, the capacitor array 44 includes a plurality of discontinuous capacitor sub-arrays. The isolation ring structure 43 includes a plurality of discontinuous isolation sub-rings. Each isolation sub-ring is arranged between two adjacent capacitor sub-arrays. The isolation ring structure 43 and the capacitor array 44 form a pattern surrounding the conductive plug 42. The pattern may be in any shape, such as a square shape, a circular shape, an elliptical shape, or a polygon shape.

The isolation ring structure 43 is electrically isolated from the capacitor array 44. The isolation ring structure 43 is grounded to play a role of electrostatic shielding, and the capacitor array 44 is not grounded to play a role of blocking the deformation stress.

Figure 8:
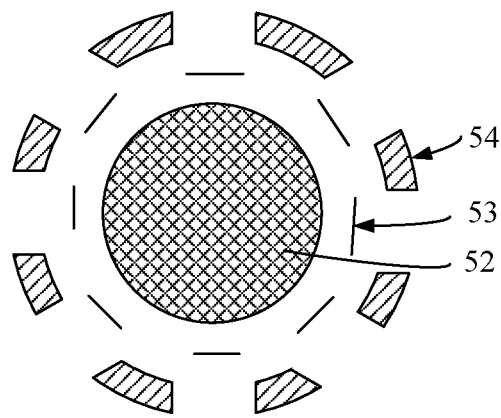
FIG. 8 is a top view of a still further semiconductor structure according to an embodiment of the present disclosure.

In some embodiments of the present disclosure, referring to FIG. 8, the capacitor array 54 including a plurality of capacitor sub-arrays constitutes a first pattern surrounding the conductive plug 52, and the isolation ring structure 53 including a plurality of isolation sub-rings constitutes a second pattern surrounding the conductive plug 52. The first pattern and the second pattern have the same shape but are at different positions. In a direction from the conductive plug 52 to the capacitor array 54, an orthographic projection of the second pattern may be complementary to the first pattern, so as to constitute a complete enclosed pattern.

In some embodiments of the present disclosure, the shape of the first pattern and the shape of the second pattern may also be different from each other, and the orthographic projection of the second pattern may also partially overlap with the first pattern, or there may be a gap between the orthographic projection of the second pattern and the first pattern.

In the embodiment of the present disclosure, in a direction from the conductive plug 22 to the first capacitor array 241, a second predetermined distance d2 is formed between the conductive plug 22 and the first capacitor array 241. The second predetermined distance d2 is comprised between 0.5 μm to 50 μm, for example, 2 μm, 10 μm or 25 μm. If the second predetermined distance d2 is too small, the first capacitor array 241 is easily damaged by the deformation stress of the conductive plug 22, so that the first capacitor array 241 cannot achieve the effect of deformation isolation, and the first capacitor array 241 cannot be used as a backup capacitor. If the second predetermined distance d2 is too large, the reserved space in the functional zone 202 may be compressed.

In the embodiment of the present disclosure, in a direction perpendicular to a surface of the substrate 20, a top surface of the second portion of the conductive plug 22 is lower than or flush with a top surface of the first capacitor array 241. In this way, it is beneficial that the deformation stress generated by the conductive plug 22 to be applied to the dielectric layer 21 must pass through the interfaces in the first capacitor array 241 or bypass the first capacitor array 241, instead of directly affecting the active area 203 on the surface of the substrate 20 or the functional element in the dielectric layer 21. That is, the deformation stress transmitted to the functional elements or the active area 203 is reduced, thereby ensuring that each of the functional elements or the active area 203 has good performance.

In the embodiment of the present disclosure, the capacitor array is used as a deformation isolation structure, and more interfaces may be provided in the capacitor array. Each interface includes a contact interface between the upper electrode and the lower electrode. When the deformation stress is transmitted in the capacitor array, the deformation stress needs to continuously pass through the interfaces or bypass the interfaces, so that relatively high transmission attenuation will be generated. In this way, it is beneficial to ensure that the deformation stress has a small impact on an element arranged on a side of the capacitor array away from the conductive plug, thereby ensuring that the semiconductor structure has good performance.

Those of ordinary skill in the art may understand that the above embodiments are specific embodiments to implement the present disclosure. In practical applications, various changes may be made in form and details without departing from the spirit and scope of the present disclosure. Any person skilled in the art may make changes and modifications without departing from the spirit and scope of the present disclosure. Therefore, the protection scope of the present disclosure should be subject to the scope defined by the appended claims.

What is claimed is:

1. A semiconductor structure, comprising:
a substrate and a dielectric layer arranged on the substrate;
a conductive plug, a first portion of the conductive plug being arranged in the substrate, and a second portion of the conductive plug being arranged in the dielectric layer; and
a capacitor array, the capacitor array at least surrounding the second portion of the conductive plug;
wherein the substrate comprises a functional zone and a Keep Out Zone (KOZ), the functional zone is arranged on a side of the KOZ away from the conductive plug, each of the KOZ and the functional zone is provided with the capacitor array, and the capacitor array in the KOZ surrounds the second portion of the conductive plug.

2. The semiconductor structure of claim 1, wherein the substrate comprises an active area in the KOZ, and the capacitor array in the KOZ is electrically connected to the active area in the KOZ.

3. The semiconductor structure of claim 1, wherein a pattern of the capacitor array in the KOZ is the same as a pattern of the capacitor array in the functional zone.

4. The semiconductor structure of claim 1, wherein in a direction from the KOZ to the functional zone, a predetermined distance is formed between the capacitor array in the KOZ and the capacitor array in the functional zone.

5. The semiconductor structure of claim 1, wherein the capacitor array in the functional zone surrounds the second portion of the conductive plug, and a surrounding configuration of the capacitor array in the KOZ is different from a surrounding configuration of the capacitor array in the functional zone.

6. The semiconductor structure of claim 1, further comprising
an isolation ring structure, wherein the isolation ring structure at least surrounds the second portion of the conductive plug, and is arranged between the conductive plug and the capacitor array.

7. The semiconductor structure of claim 1, wherein the capacitor array is grounded.

8. The semiconductor structure of claim 1, wherein in a direction from the conductive plug to the capacitor array, a distance between the conductive plug and the capacitor array is between 0.05 μm and 50 μm.

9. The semiconductor structure of claim 1, wherein in a direction perpendicular to a surface of the substrate, a top surface of the second portion of the conductive plug is lower than or flush with a top surface of the capacitor array.

10. The semiconductor structure of claim 1, wherein the capacitor array is formed by a plurality of capacitor circuits.

11. The semiconductor structure of claim 2, wherein the KOZ is provided with a capacitor contact window configured for connecting the active area and the capacitor array in the KOZ with each other.

12. The semiconductor structure of claim 2, wherein in the KOZ, the substrate is provided with an isolation structure for isolating two adjacent active areas from one another.

13. The semiconductor structure of claim 4, wherein the predetermined distance is between 0.2 μm and 20 μm.

14. A semiconductor structure, comprising:
a substrate and a dielectric layer arranged on the substrate;
a conductive plug, a first portion of the conductive plug being arranged in the substrate, and a second portion of the conductive plug being arranged in the dielectric layer; and
a capacitor array, the capacitor array at least surrounding the second portion of the conductive plug;
wherein
the capacitor array comprises a plurality of discontinuous capacitor sub-arrays, and wherein the semiconductor structure further comprises an isolation ring structure, the isolation ring structure comprising a plurality of discontinuous isolation sub-rings, each isolation sub-ring being arranged between two adjacent capacitor sub-arrays, the isolation ring structure and the capacitor array form a pattern surrounding the conductive plug, and the isolation ring structure and the capacitor array being electrically isolated from each other.

15. A semiconductor structure, comprising:
a substrate and a dielectric layer arranged on the substrate;
a conductive plug, a first portion of the conductive plug being arranged in the substrate, and a second portion of the conductive plug being arranged in the dielectric layer; and
a capacitor array, the capacitor array at least surrounding the second portion of the conductive plug;
wherein
the substrate comprises a functional zone and a Keep Out Zone (KOZ), the functional zone is arranged on a side of the KOZ away from the conductive plug, each of the KOZ and the functional zone is provided with the capacitor array, and the capacitor array in the KOZ surrounds the second portion of the conductive plug;
the substrate comprises an active area in the KOZ, and the capacitor array in the KOZ is electrically connected to the active area in the KOZ; and
the KOZ is provided with a capacitor contact window configured for connecting the active area and the capacitor array in the KOZ with each other.

16. The semiconductor structure of claim 15, wherein a pattern of the capacitor array in the KOZ is the same as a pattern of the capacitor array in the functional zone.

17. The semiconductor structure of claim 15, wherein in a direction from the KOZ to the functional zone, a predetermined distance is formed between the capacitor array in the KOZ and the capacitor array in the functional zone.

18. The semiconductor structure of claim 17, wherein the predetermined distance is between 0.2 μm and 20 μm.

19. The semiconductor structure of claim 15, wherein in a direction perpendicular to a surface of the substrate, a top surface of the second portion of the conductive plug is lower than or flush with a top surface of the capacitor array.

20. The semiconductor structure of claim 15, further comprising
an isolation ring structure, wherein the isolation ring structure at least surrounds the second portion of the conductive plug, and is arranged between the conductive plug and the capacitor array.

\* \* \* \* \*